(12) United States Patent
Shimodaira et al.

(10) Patent No.: US 9,800,224 B2
(45) Date of Patent: Oct. 24, 2017

(54) ELECTRONIC DEVICE, ELECTRONIC APPARATUS, AND MOVING OBJECT

(71) Applicant: SEIKO EPSON CORPORATION, Tokyo (JP)

(72) Inventors: Kazuhiko Shimodaira, Minowa-machi (JP); Kyo Horie, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 96 days.

(21) Appl. No.: 15/013,494

(22) Filed: Feb. 2, 2016

(65) Prior Publication Data

US 2016/0156330 A1 Jun. 2, 2016

Related U.S. Application Data

(63) Continuation of application No. 14/302,713, filed on Jun. 12, 2014, now Pat. No. 9,287,881.

(30) Foreign Application Priority Data

Jun. 13, 2013 (JP) .................................. 2013-124421

(51) Int. Cl.
| | | |
|---|---|---|
| *H03L 1/02* | (2006.01) | |
| *H03H 9/02* | (2006.01) | |
| *H03B 5/32* | (2006.01) | |
| *H03H 9/17* | (2006.01) | |

(52) U.S. Cl.
CPC ........... *H03H 9/02448* (2013.01); *H03B 5/32* (2013.01); *H03H 9/17* (2013.01); *H03L 1/02* (2013.01); *H03L 1/028* (2013.01); *H01L 2224/48091* (2013.01); *H01L 2224/48465* (2013.01)

(58) Field of Classification Search
CPC .............. H03L 1/00; H03L 1/02; H03L 1/028
See application file for complete search history.

(56) References Cited

U.S. PATENT DOCUMENTS

| | | |
|---|---|---|
| 6,147,565 A | 11/2000 | Satoh et al. |
| 6,559,728 B1 | 5/2003 | Fry |
| 7,023,291 B2 | 4/2006 | Kato et al. |
| 7,514,852 B2 | 4/2009 | Kasahara et al. |
| 7,759,843 B2 | 7/2010 | Okubo |
| 8,013,683 B2 | 9/2011 | Arai |

(Continued)

FOREIGN PATENT DOCUMENTS

| | | |
|---|---|---|
| JP | S59-56784 U | 4/1984 |
| JP | S61-7124 U | 1/1986 |

(Continued)

OTHER PUBLICATIONS

Apr. 1, 2015 Office Action issued in U.S. Appl. No. 14/302,713.
Aug. 25, 2015 Office Action issued in U.S. Appl. No. 14/302,713.
Nov. 20, 2015 Office Action issued in U.S. Appl. No. 14/302,713.

*Primary Examiner* — Jeffrey Shin
(74) *Attorney, Agent, or Firm* — Oliff PLC

(57) ABSTRACT

An electronic device includes a heat generator having a terminal, a resonator which has an outer connection terminal and on which the heat generator is disposed, a first substrate having a first surface and a second surface with the resonator connected to the first surface, and a circuit part and other electronic parts disposed on the first surface or the second surface. The outer connection terminal of the resonator is connected to the first surface, and the terminal of the heat generator is connected to the second surface.

9 Claims, 9 Drawing Sheets

(56) References Cited

U.S. PATENT DOCUMENTS

| | | |
|---|---|---|
| 8,089,325 B2 | 1/2012 | Kudo |
| 2006/0290239 A1 | 12/2006 | Kasahara et al. |
| 2008/0061898 A1 | 3/2008 | Soga et al. |
| 2009/0051446 A1 | 2/2009 | McCracken |
| 2011/0193637 A1 | 8/2011 | Kasahara |
| 2012/0235761 A1 | 9/2012 | Mitome et al. |

FOREIGN PATENT DOCUMENTS

| | | |
|---|---|---|
| JP | 2007-006270 A | 1/2007 |
| JP | 2008-028620 A | 2/2008 |
| JP | 2010-098418 A | 4/2010 |
| JP | 2010-154227 A | 7/2010 |
| JP | 2010-177732 A | 8/2010 |
| JP | 4793155 B2 | 11/2011 |
| JP | 4804813 B2 | 11/2011 |

ELECTRONIC DEVICE, ELECTRONIC APPARATUS, AND MOVING OBJECT

This application is a continuation application of U.S. patent application Ser. No. 14/302,713 filed Jun. 12, 2014, which claims priority to Japanese Patent Application No. 2013-124421 filed Jun. 13, 2013, the entire disclosures of which are incorporated herein by reference.

BACKGROUND

1. Technical Field

The present invention relates to an electronic device, an electronic apparatus including the electronic device, and a moving object including the electronic device.

2. Related Art

In recent years, requirements of size reduction and high precision of an electronic apparatus require an electronic device including a quartz crystal resonator or any other resonation device to be increasingly small and highly precise. In particular, to be insensitive to ambient temperature to achieve high frequency stability, an OCXO (oven controlled xtal oscillator) or any other similar electronic device is used. An OCXO has a thermostatic oven in which a heat generator heats a crystal resonator and the space around the crystal resonator is maintained at a fixed temperature. A thus configured OCXO, however, includes not only the crystal resonator but also an IC, a chip inductor, and other parts for an oscillation circuit that have temperature-sensitive characteristics, and the frequency characteristic of the OCXO is undesirably not stabilized unless the temperatures of the parts described above are stabilized.

To address the problem described above, for example, JP-A-2010-98418 discloses a structure in which a heat generator is mounted on a resonator and an outer connection terminal of the resonator is connected to one surface of a substrate. Further, JP-A-2008-28620 discloses a configuration in which a heat generator is mounted on a resonator having a lead terminal and the lead terminal of the resonator or a terminal of the heat generator is connected to an edge of a substrate (side surface of substrate).

In the configuration in JP-A-2010-98418 described above, however, since the outer connection terminal of the resonator, on which the heat generator is mounted, is connected to one surface of the substrate, heat is conducted from the one surface of the substrate, which means that electronic parts disposed on the other surface of the substrate cannot be efficiently heated. Further, since the substrate itself can be heated only from the one side, the temperature of the substrate is not stabilized, and the temperatures of the electronic parts disposed on the substrate are not stabilized. In the configuration described in JP-A-2008-28620, since heat conducted from the resonator passes through the lead terminal having poor heat conductivity, the efficiency of heating the substrate decreases. Further, since the terminal of the heat generator is connected to a side surface of the substrate, the heat needs to be then conducted to the front and rear surfaces of the substrate, which means that heating efficiency is inferior to that in a case where the front or rear surface of the substrate is heated. As a result, the temperature of the substrate is not stabilized, and hence the temperatures of electronic parts disposed on the substrate are not stabilized.

As described above, in an electronic device having any of the configurations of the related art, it is difficult to efficiently conduct heat from a heated resonator to a substrate on which other electronic parts are mounted, undesirably resulting in a situation in which the temperature of each of the electronic parts disposed on the substrate and having a temperature-sensitive characteristic is not stabilized and hence the temperature-sensitive characteristic of the electronic device is not stabilized.

SUMMARY

An advantage of some aspects of the invention is to solve at least apart of the problems described above, and the invention can be implemented as the following forms or application examples.

Application Example 1

An electronic device according to this application example includes a heat generator having a terminal, a resonator which has an outer connection terminal and on which the heat generator is disposed, a first substrate having a first surface and a second surface, and an electronic part disposed on the first substrate. The outer connection terminal is connected to the first surface, and the terminal of the heat generator is connected to the second surface.

According to this application example, the surface-mounting outer connection terminal of the resonator, on which the heat generator is mounted and which is heated by the heat generator, is connected to the first surface of the first substrate, and the terminal of the heat generator is disposed on the second surface of the first substrate. Heat from the heat generator is therefore conducted not only to the first surface of the first substrate via the resonator but also to the second surface of the first substrate via the terminal, whereby the two surfaces of the first substrate are heated. As a result, the two surfaces of the first substrate can be uniformly heated, whereby the electronic part disposed on the first substrate can be efficiently heated. The electronic part can therefore be maintained at a fixed temperature, whereby an electronic device with stable characteristics maintained can be provided even when the electronic device uses an electronic part having a temperature-sensitive characteristic.

Application Example 2

In the electronic device according to the application example described above, it is preferable that the outer connection terminal is disposed on a bottom surface of a container of the resonator.

According to this application example, since the outer connection terminal disposed on the bottom surface of the container of the resonator is connected to the first substrate, the amount of loss in heat conducted from the resonator is smaller than the amount of loss in a case where heat is conducted via a lead terminal or any other component, whereby the efficiency of heating the first substrate can be increased and hence the efficiency of heating the electronic part disposed on the first substrate can be increased.

Application Example 3

In the electronic device according to the application example described above, it is preferable that a wiring line is provided on each of the first surface and the second surface, and at least one of the wiring line to which the terminal of the heat generator is connected and the wiring line to which the outer connection terminal is connected overlaps with the electronic part in a plan view.

According to this application example, at least one of the wiring lines, each of which is a heat conduction path, overlaps with the electronic part disposed on the first substrate, in other words, the wiring line is in contact with the electronic part, whereby the efficiency of heating the electronic part can be increased.

Application Example 4

In the electronic device according to the application example described above, it is preferable that the first surface is a front surface and the second surface is a rear surface facing away from the front surface, a through portion that passes through the first surface and the second surface is provided, and the heat generator is so disposed that the heat generator is adjacent to the through portion.

According to this application example, since the heat generator is so disposed that the heat generator is adjacent to the through portion, the first substrate has a small volume, that is, small heat capacity, whereby the efficiency of heating the first substrate can be increased and hence the efficiency of heating the electronic part disposed on the first substrate can be increased.

Application Example 5

In the electronic device according to the application example described above, it is preferable that a heat conduction member having heat conductivity higher than the heat conductivity of the first substrate is connected at least to the outer connection terminal, and the heat conduction member is connected at least to the first surface.

According to this application example, a heat conduction member having heat conductivity higher than that of the first substrate is connected to the outer connection terminal of the heated resonator, and the heat conduction member is connected at least to the first surface of the first substrate, whereby heat can be readily conducted to the first substrate and hence the efficiency of heating the electronic part disposed on the first substrate can be increased.

Application Example 6

In the electronic device according to the application example described above, it is preferable that the heat conduction member is disposed between the resonator and the heat generator.

According to this application example, the heat conduction member that directly receives heat from the heat generator allows the heat from the heat generator to be readily conducted to the first substrate, whereby the efficiency of heating the electronic part disposed on the first substrate can be increased.

Application Example 7

In the electronic device according to the application example described above, it is preferable that the electronic device further includes a second substrate at least mechanically connected to the first substrate.

According to this application example, since a constituent part having characteristics that do not greatly change with temperature or characteristics that are not so sensitive to temperature, so to speak, can be mounted on the second substrate, requisite minimum heated area (first substrate) only needs to be heated to improve the efficiency of heating the first substrate and hence the efficiency of heating the electronic part disposed on the first substrate.

Application Example 8

In the electronic device according to the application example described above, it is preferable that the electronic device further includes a lid connected to the second substrate, and the second substrate and the lid preferably surround and accommodate the first substrate.

According to this application example, the first substrate is accommodated in a space formed by the second substrate and the lid. Further, since the space can be hermitically sealed and thermally insulated, the temperature of the first substrate can be more stably fixed and hence the temperature of the electronic part disposed on the first substrate can be fixed.

Application Example 9, Application Example 10

In the electronic device according to the application example described above, it is preferable that the electronic device further includes a third substrate connected to the first substrate via an electrically conductive member and supported by the electrically conductive member, the third substrate has one surface which faces the first substrate and on which the electrically conductive member stands and another surface which faces away from the one surface and on which a mount terminal is provided, the first substrate is electrically connected to the electrically conductive member, and the electrically conductive member passes through the second substrate and is preferably connected to the mount terminal via a wiring line disposed on the one surface of the third substrate.

According to this application example, since the mount terminal on the third substrate and the electrically conductive member are not directly connected to each other but connected to each other via the wiring line, the heat conduction path through which heat is conducted from the first substrate can be increased, whereby the substrate on which the electronic device is mounted is unlikely to directly thermally affect the first substrate.

Application Example 11

An electronic apparatus according to this application example includes the electronic device described in any of the application examples described above.

According to this application example, since the electronic apparatus uses an electronic device having a stable temperature-sensitive characteristic, the electronic apparatus is not affected by variation in environment temperature but can operate in a stable manner.

Application Example 12

A moving object according to this application example includes the electronic device described in any of the application examples described above.

According to this application example, since the moving object uses an electronic device having a stable temperature-sensitive characteristic, the moving object is not affected by variation in environment temperature but can operate in a stable manner.

BRIEF DESCRIPTION OF THE DRAWINGS

The invention will be described with reference to the accompanying drawings, wherein like numbers reference like elements.

FIG. 1A is a schematic plan view showing the interior of the electronic device, and FIG. 1B is a cross-sectional view of the electronic device taken along the line B-B in FIG. 1A.

FIG. 4A is a plan view, and FIG. 4B is a front cross-sectional view.

FIG. 6A is a schematic plan view showing the interior of the electronic device, and FIG. 6B is a cross-sectional view of the electronic device taken along the line B-B in FIG. 6A.

FIG. 7A is a schematic plan view showing the interior of the electronic device, and FIG. 7B is a cross-sectional view of the electronic device taken along the line B-B in FIG. 7A.

DESCRIPTION OF EXEMPLARY EMBODIMENTS

An electronic device, an electronic apparatus, and a moving object according to embodiments of the invention will be described below in detail with reference to the drawings.

Electronic Device

First Embodiment

Figure 1A:
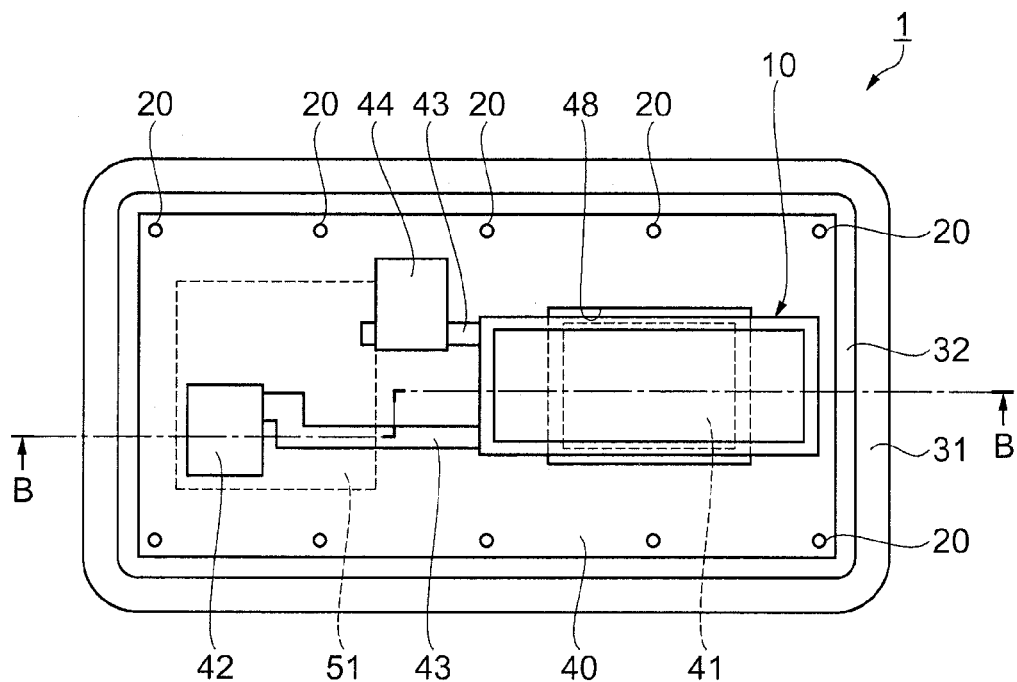
FIGS. 1A and 1B are schematic configuration diagrams of an electronic device according to a first embodiment of the invention.
Figure 1B:
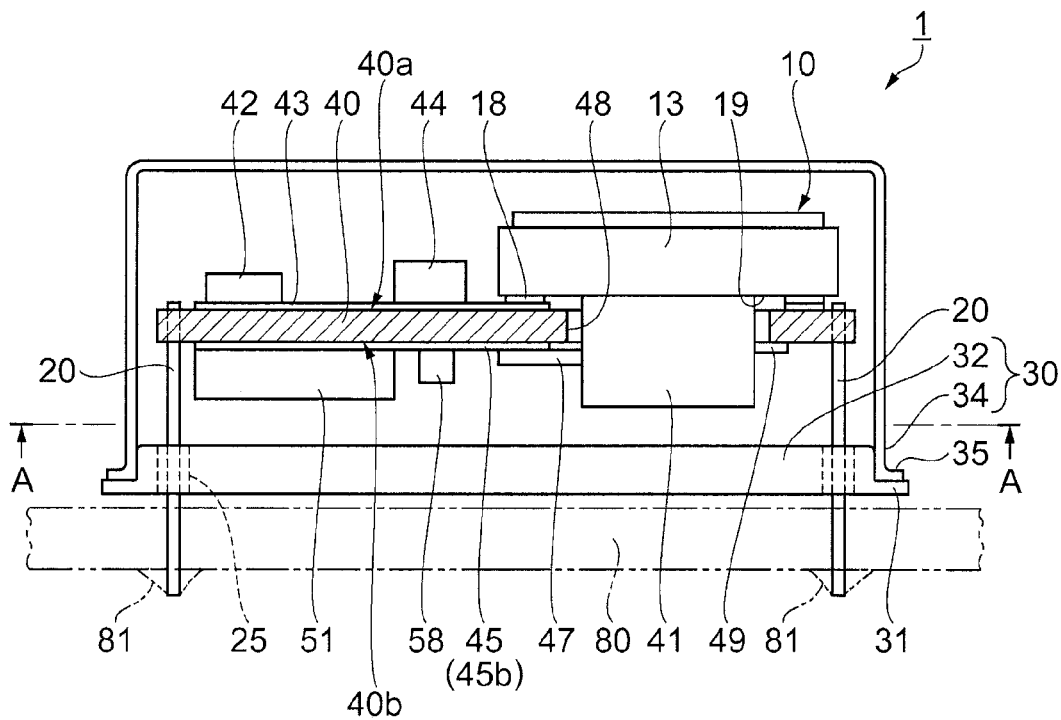
Figure 2:
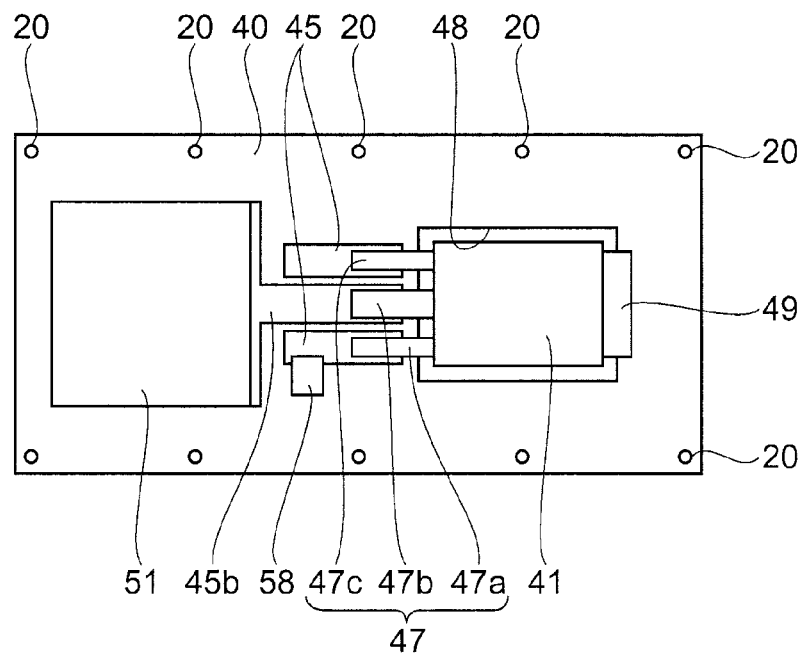
FIG. 2 is a cross sectional view of the electronic device taken along the line A-A in FIG. 1B.
Figure 3:
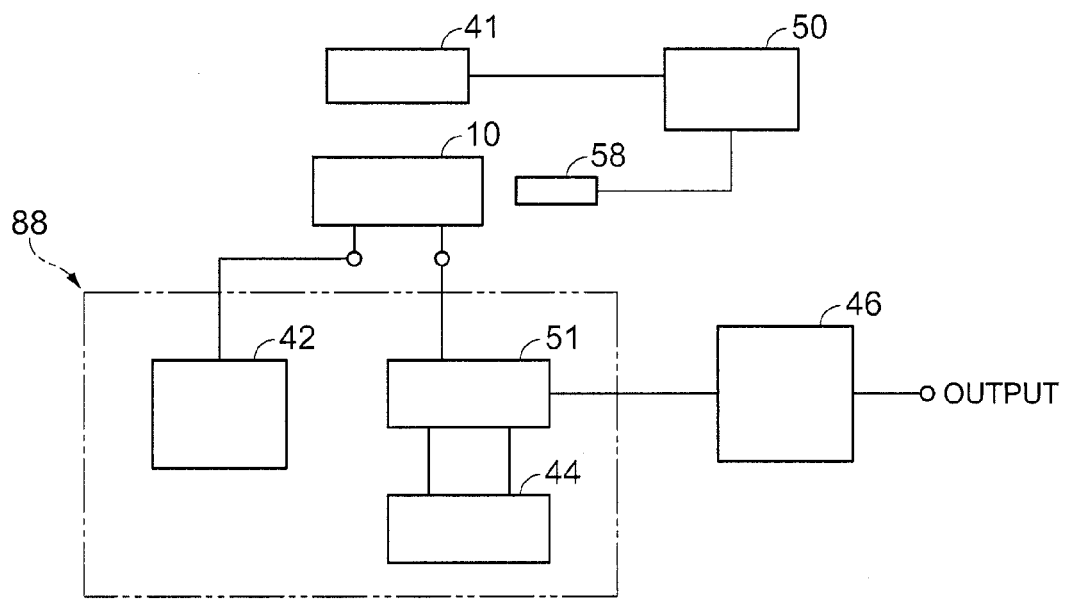
FIG. 3 is a block diagram showing a circuit configuration of the electronic device according to the first embodiment of the invention.

FIGS. 1A and 1B are schematic configuration diagrams of an electronic device according to a first embodiment of the invention. FIG. 1A is a schematic plan view showing the interior of the electronic device, and FIG. 1B is a cross-sectional view of the electronic device taken along the line B-B in FIG. 1A. FIG. 2 is a cross sectional view of the electronic device taken along the line A-A in FIG. 1B. FIG. 3 is a block diagram showing a circuit configuration of the electronic device according to the first embodiment of the invention. FIG. 1A shows a state in which an upper portion of a cover 34 is removed for ease of description of the internal configuration of the electronic device 1. Further, in FIG. 1B, some of juxtaposed pin members 20, each of which serves as an electrically conductive member, are omitted for ease of illustration.

Overall Configuration

The electronic device 1 shown in FIGS. 1A and 1B includes a first substrate 40, to which a resonator 10, a heat generator 41, a circuit part 51, and other electronic parts, are electrically and mechanically connected, a second substrate 32, which is at least mechanically connected to the first substrate 40 via pin members 20, each of which serves as an electrically conductive member, and a cover 34, which is a lid that surrounds and accommodates the first substrate 40 and is connected to the second substrate 32. In other words, the electronic device 1 according to the first embodiment of the invention corresponds to an OCXO (oven controlled xtal oscillator). It is noted that an amplification circuit section 46 and a control circuit section 50 shown in FIG. 3, each of which is an electronic part, are also connected to the first substrate 40 but are not shown in FIG. 1A, 1B, or 2.

The first substrate 40 has a first surface 40a, which is one surface, and a second surface 40b, which is a rear surface facing away from the first surface 40a or a front surface. A through portion 48, which passes through the first surface 40a and the second surface 40b, is provided through the first substrate 40. The heat generator 41 is so disposed that the heat generator is adjacent to the through portion 48. Since the heat generator 41 is so disposed that the heat generator is adjacent to the through portion 48 as described above, the first substrate 40 has a small volume, that is, small heat capacity, whereby the efficiency of heating the first substrate 40 can be increased.

The first substrate 40 is made of a ceramic material, a glass epoxy material, or any other insulating material. Electrodes, terminals, wiring lines 43, 45, and 45b and through electrodes (not shown) that electrically connect the electrodes and terminals to each other, and other components provided on the first substrate 40 and the second substrate 32 are typically formed by depositing tungsten (W), molybdenum (Mo), or any other metal material on the substrates in a screen printing process followed by baking, and plating the printed substrates with nickel (Ni), gold (Au), or any other substance or by coating a copper foil over each of the substrates and forming the components described above in an etching process. The wiring lines 43, 45, and 45b made of tungsten (W), molybdenum (Mo), or any other metal material plated with nickel (Ni), gold (Au), or any other substance preferably have heat conductivity higher than that of the ceramic material (heat conductivity: 17 W/m·K) or the glass epoxy material (heat conductivity: 0.6 W/m·K) that forms the first substrate 40. Heat from the heat generator 41 and the resonator 10 heated by the heat generator 41 can therefore be more efficiently conducted to the circuit part 51 and other electronic parts.

The resonator 10 has an outer connection terminal 18 formed on a rear surface 19 of a package (container) of the resonator 10, and the outer connection terminal 18 is formed of a metal film and allows surface mounting of the resonator 10. The resonator 10 is connected to the first surface 40a of the first substrate 40 via the outer connection terminal 18 and so disposed that the resonator 10 faces the first surface 40a of the first substrate 40. As described above, since the outer connection terminal 18 provided on the rear surface (bottom surface) 19 of the container of the resonator 10 is connected to the first surface 40a of the first substrate 40 directly or via a connection material, such as a soldering material or an electrically conductive adhesive, and so disposed that the outer connection terminal 18 faces the second surface of the first substrate 40, the amount of loss in heat conducted from the resonator 10 is smaller than the amount of loss in a case where heat is conducted via a lead terminal or any other component, whereby the efficiency of heating the first substrate 40 can be increased and hence the efficiency of heating the circuit part 51 disposed on the first substrate 40 can be increased.

Further, the heat generator 41 disposed on the rear surface 19 of the package (container) 13 of the resonator 10 is connected to the second surface 40b of the first substrate 40 via a terminal 47. As described above, since the terminal 47 (47a, 47b, 47c) of the heat generator 41 is connected to the second surface 40b of the first substrate 40 directly or via a connection material, such as a soldering material or an electrically conductive adhesive, the efficiency of heating the first substrate 40 along with the resonator 10 can be increased. The heat generator 41 may be provided with a heat dissipation plate that protrudes from an opposite end surface of the heat generator 41 to the terminal 47. When the heat dissipation plate is disposed on the first substrate 40 or the wiring lines 43, 45, or 45b, the heat dissipation plate can further increase the efficiency of heating the first substrate 40 and can hence increase the efficiency of heating the electronic parts disposed on the first substrate 40.

The wiring line 43 is disposed on the first surface 40a of the first substrate 40. In a plan view of the electronic device 1 viewed from the side facing the first surface 40a of the first substrate 40, a load capacitance 42, a filter circuit 44, and other components are so disposed as electronic parts that they are disposed in the vicinity of the wiring line 43, overlap with the wiring line 43, or are connected to the wiring line 43. Further, the wiring lines 45 and 45b are disposed on the second surface 40b of the first substrate 40. In a plan view of the electronic device 1 viewed from the side facing the second surface 40b of the first substrate 40, the circuit part 51 is so disposed that the circuit part is disposed in the vicinity of the wiring lines 45 and 45b or overlap with the wiring line 45b, and a thermo-sensitive element 58 as an electronic part is so disposed that a thermo-sensitive element overlaps with the wiring line 45. As described above, the arrangement in which the electronic parts are disposed in the vicinity of the wiring lines 43, 45, and 45b allows heat conducted through the wiring lines 43, 45, and 45b to be readily conducted to the electronic parts. Further, the wiring lines 43, 45, and 45b, each of which is a heat conduction path, and the respective electronic parts are so disposed that they overlap with each other in a plan view, or the wiring lines 43, 45, and 45b are connected to the respective electronic parts, in other words, the wiring lines 43, 45, and 45b are in contact with the respective electronic parts, whereby the heat generator 41 can further efficiently heat the electronic parts. Each of the constituent parts described above is connected via a connection material, such as a soldering material, a metal bump, or an electrically conductive adhesive. All the electronic parts are not necessarily disposed on the first substrate 40, but some of them may be disposed on the resonator 10 or the heat generator 41.

Further, each of the electronic parts is desirably disposed in the vicinity of at least one of the following connection portions: a connection portion where the terminal 47 of the heat generator 41 is connected to the second surface 40b of the first substrate 40; and a connection portion where the outer connection terminal 18 of the resonator 10 is connected to the first surface 40a of the first substrate 40. The configuration described above allows the electronic parts to be readily heated in an efficient manner.

A package 30 of the electronic device 1 is formed of the second substrate 32 and the cover 34 as a lid. The pin members 20, each of which serves as an electrically conductive member, is hermetically held with a hermetic seal 25, and extends upward and downward in FIG. 1B from the second substrate 32, are disposed on the second substrate 32 at a plurality of locations (10 in the present embodiment). One end portion of each of the pin members 20 is connected to the first substrate 40 with a connection material, such as a soldering material, a metal bump, or an electrically conductive adhesive. The structure described above, in which the resonator 10 on which the heat generator 41 is mounted and the first substrate 40 on which the circuit part 51 including an oscillation amplifier is disposed are separate from the second substrate 32, reduces the amount of heat from the heat generator 41 to be conducted to the atmosphere via the second substrate 32 but allows the heat from the heat generator 41 to be effectively used. As a result, the amount of current consumption can be reduced, and the amount of power consumption of the electronic device 1 can be reduced accordingly.

The second substrate 32 is made, for example, of a metal material, such as an alloy of iron (Fe) and nickel (Ni). The surface of the second substrate 32 may be plated, for example, with Nickel (Ni). The second substrate 32 is not necessarily made of a metal material and may instead be made of a ceramic material.

The cover 34, which serves as a lid, covers the resonator 10 and the first substrate 40 and is bonded to the second substrate 32. The cover 34, specifically, a collar 35 thereof is bonded to a flange 31 of the second substrate 32, for example, in a resistance welding process. The interior surrounded by the cover 34 of the package 30 and the second substrate 32 is sealed so that a gas does not flow into the interior or flow out thereof and hence no heat is dissipated via such a gas. The interior of the package 30 is preferably under a reduced pressure atmosphere, for example, under vacuum, in order to prevent heat from being dissipated due to heat conduction via a gas.

The cover 34 may be made of kovar or any other metal material or a ceramic material. It is noted that a metal material is advantageous because a sealing effect thereof blocks external electrical influence.

Each of the pin members 20 as an electrically conductive member has a columnar shape and is made of an electrically conductive material, for example, copper (Cu), iron (Fe) and nickel (Ni), or kovar. Using a metal material having poor heat conductivity, such as 42 Alloy or kovar, each of which is an alloy produced by adding nickel (Ni) to iron (Fe), prevents heat in the first substrate 40 from being conducted to the second substrate 32, whereby the resonator 10, the circuit part 51, and other components connected to the first substrate 40 can be maintained at more constant temperatures. The electrically conductive members are not limited to the pin members 20 described above and may be any members that can support the first substrate 40 and are electrically conductive, such as a lead frame member and a block member. In the present embodiment, each of the pin members 20 is supported by the hermetic seal 25 formed in the second substrate 32 but may instead be supported by the second substrate 32 with no hermetic seal 25. Further, electronic parts may be mounted on the second substrate 32 and electrically connected to the pin members 20.

Further, each of the pin members 20, which are supported by the hermetic seals 25, has a portion that protrudes in the direction facing away from the first substrate 40 and can be used as a mounting terminal. In this case, for example, the portion of each of the pin members 20 that is inserted into a through hole provided in a mount substrate 80, which is indicated by an imaginary line, is connected to the mount substrate 80, for example, with a soldering material 81.

Heat Conduction Member

The above configuration has been described with reference to the case where the wiring lines 43, 45, and 45b, which are formed on the first surface 40a and the second surface 40b of the first substrate 40, for example, in an etching process, are used as heat conduction members, but the configuration described above may be replaced with the following configuration using another heat conduction member.

(1) The outer connection terminal 18 of the resonator 10 is connected to a lead frame as a heat conduction member made of a material having heat conductivity higher than that of the first substrate 40, for example, copper (Cu), gold (Au), silver (Ag), iron (Fe), aluminum (Al), or tungsten (W), or an alloy primarily containing any of the substances described above, for example, 42 Alloy, which is an alloy produced by adding nickel (Ni) to iron (Fe). The lead frame extends over the first surface 40a of the first substrate 40.

(2) The heat conduction member described above is disposed between the resonator 10 and the heat generator 41 and extends at least over the first surface 40a of the first substrate 40.

(3) The heat conduction member described above is connected to the terminal 47 of the heat generator 41 and extends at least over the second surface 40b of the first substrate 40.

The heat conductivity of each of the portions in this case follows.

As the material that forms the first substrate 40, the glass epoxy material (heat conductivity: 0.6 W/m·K) or the ceramic material (heat conductivity: 17 W/m·K);

As the material that forms the heat conduction member, copper (Cu) (heat conductivity: 401 W/m·K), gold (Au) (heat conductivity: 318 W/m·K), silver (Ag) (heat conductivity: 429 W/m·K), iron (Fe) (heat conductivity: 80 W/m·K), aluminum (Al) (heat conductivity: 238 W/m·K), tungsten (W) (heat conductivity: 174 W/m·K), or 42 Alloy (heat conductivity: 14.6 W/m·K), which is an alloy produced by adding nickel (Ni) to iron (Fe). The materials described above are presented by way of example, and other materials having similar characteristics may be used.

According to the configuration described above, in which a heat conduction member having heat conductivity higher than that of the first substrate 40 is connected to the outer connection terminal 18 of the heated resonator 10, and the heat conduction member is connected at least to the first surface 40a of the first substrate 40, heat from the resonator 10 can be readily conducted to the first substrate 40. Further, since the heat conduction member that directly receives heat from the heat generator 41 is connected at least to the first surface 40a of the first substrate 40, the heat can be further readily conducted to the first substrate 40. Moreover, since the heat conduction member connected to the terminal 47 of the heat generator 41 is connected at least to the second surface 40b of the first substrate 40, heat from the heat generator 41 can be directly conducted to the first substrate 40, whereby the heat can be more efficiently conducted.

Circuit Configuration

The circuit configuration of the electronic device according to the embodiment of the invention will next be described with reference to FIG. 3. The circuit of the electronic device 1 is formed, for example, of an oscillation circuit section 88, which causes the resonator 10 to oscillate, electronic parts such as the amplification circuit section 46, which amplifies an oscillation signal, and a control circuit section 50, which controls the heat generator 41 to maintain the resonator 10 at a fixed temperature, as shown in FIG. 3.

The oscillation circuit section 88 is formed, for example, of the load capacitance 42, which includes a variable capacitance element necessary for oscillation, the circuit part 51, which includes an oscillation amplification element that tends to be sensitive to a change in temperature, and the filter circuit 44, which includes an inductor that suppresses a fundamental wave mode of a resonator element and allows an overtone wave mode to be readily oscillated.

Since the variable capacitance element in the load capacitance 42 and the inductor in the filter circuit 44 have constants that greatly change in accordance with ambient temperature, they are disposed, along with the oscillation amplification element, in the vicinity of the heat generator 41, whereby the variable capacitance element and the inductor can be maintained at fixed temperatures. As a result, the temperature characteristic of the oscillation circuit section 88 that causes the resonator 10 to oscillate can be stabilized, and the frequency stability of the electronic device 1 can be improved accordingly.

The control circuit section 50 controls the heat generator 41 fixed to the resonator 10 based on temperature information from the thermo-sensitive element 58 disposed in the vicinity of the resonator 10 to keep the resonator 10 at a fixed temperature. The heat generator 41 is, for example, a heater or a power transistor, and the thermo-sensitive element 58 is, for example, a thermistor or a quart crystal resonator for a temperature sensor.

Resonator

Figure 4A:
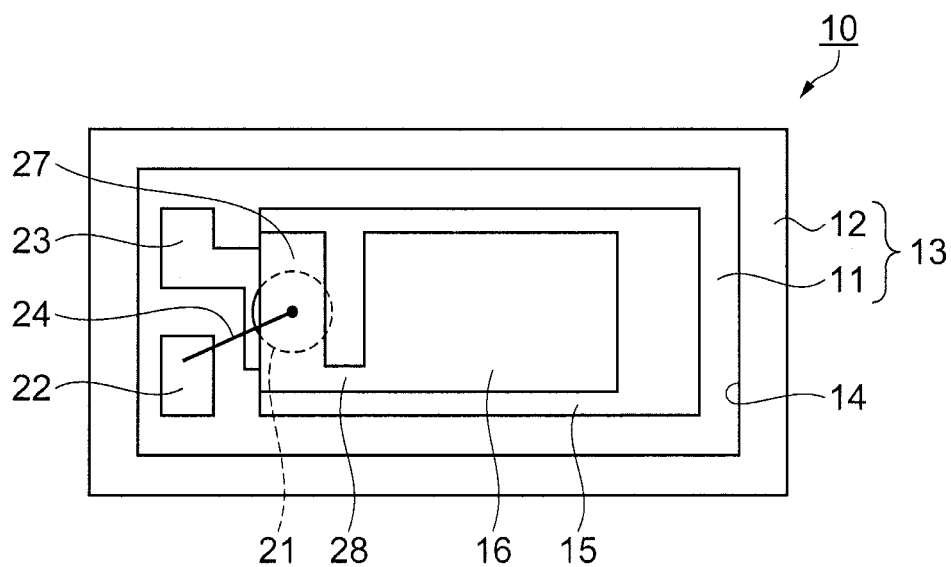
FIGS. 4A and 4B schematically show a resonator.
Figure 4B:
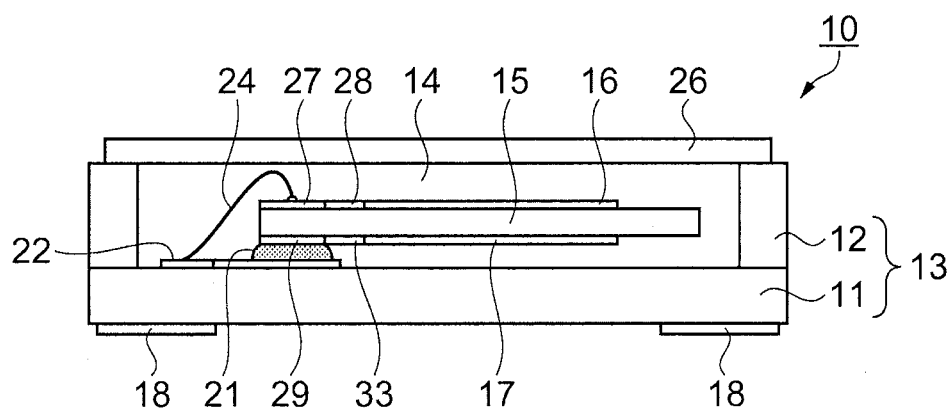

The resonator 10 will now be described with reference to FIGS. 4A and 4B. FIGS. 4A and 4B schematically show the resonator. FIG. 4A is a plan view, and FIG. 4B is a front cross-sectional view. FIG. 4A shows a state in which a lid is removed for ease of description of the interior configuration of the resonator 10. The resonator 10 according to the first embodiment shown in FIGS. 4A and 4B includes a resonator element 15, a package 13, which accommodates the resonator element 15, and a lid 26, which together with the package 13 forms an interior space 14 as an accommodation space. The resonator element 15, the package 13, and the lid 26 will be sequentially described in detail.

Resonator Element

The resonator element 15 in the present embodiment is formed of an AT-cut quartz crystal substrate (piezoelectric substrate) made of quartz crystal as an example of a piezoelectric material. Piezoelectric materials, such as quartz crystal, belong to a trigonal system and have quartz crystal axes X, Y, and Z perpendicular to each other. The X, Y, and Z axes are called an electrical axis, a mechanical axis, and an optical axis, respectively. The quartz crystal substrate, which serves as the resonator element 15, is a flat plate produced by cutting a quartz crystal block along a plane obtained by rotating an XZ plane around the X axis by a predetermined angle $\theta$. For example, an AT-cut quartz crystal substrate is produced by setting the angle $\theta$ at about 35° 15'. The Y axis and the Z axis are also rotated around the X axis by the angle $\theta$, and the resultant axes are called a Y' axis and a Z' axis, respectively. The AT-cut quartz crystal substrate therefore has the quartz crystal axes X, Y', and Z' perpendicular to each other. The AT-cut quartz crystal substrate has a thickness direction along the Y' axis. The principal plane of the AT-cut quartz crystal substrate is an XZ' plane (plane containing X axis and Z' axis) perpendicular to the Y' axis, and thickness share vibration occurs as primary vibration in the AT-cut quartz crystal substrate when it is excited. The AT-cut quartz crystal substrate is shaped to form a piezoelectric substrate as a base plate of the resonator element 15. That is, the piezoelectric substrate is formed of an AT-cut quartz crystal substrate that is defined as follows: In an orthogonal coordinate system formed of the X axis (electrical axis), the Y axis (mechanical axis), and the Z axis (optical axis), the Z axis is inclined around the X axis toward the −Y side of the Y axis to form the Z' axis; the Y axis is inclined around the X axis toward the +Z side of the Z axis to form the Y' axis; and the AT-cut quartz crystal substrate is formed of a plane parallel to the X axis and the Z' axis and has a thickness in the direction parallel to the Y' axis.

The quartz crystal substrate according to the embodiment of the invention is not limited to the AT-cut quartz crystal substrate produced by setting the angle θ at about 35° 15' as described above, and an SC-cut, BT-cut, and a large number of other types of piezoelectric substrate that allow excitation of thickness share vibration can be used. For example, what is called a double-rotation-cut quartz crystal substrate may be used. Based on the X axis called an electrical axis, the Y axis called a mechanical axis, and the Z axis called an optical axis of crystal, the double-rotation-cut quartz crystal substrate has an edge parallel to an X' axis set by rotating the X axis around the Z axis clockwise by an angle ϕ greater than or equal to 3° but smaller than or equal to 30° and an edge parallel to a Z' axis set by rotating the Z axis around the X' axis clockwise by an angle ϕ greater than or equal to 33° but smaller than or equal to 36°. When ϕ is about 22° and ϕ is about 34°, an SC-cut quartz crystal substrate is produced.

The resonator element 15 in the present embodiment is formed of a rectangular element piece formed by dividing the AT-cut quartz crystal substrate (piezoelectric substrate) made of quartz crystal as an example of a piezoelectric material, and a variety of electrodes are formed on the element piece, as shown in FIGS. 4A and 4B. In this example, the variety of electrodes include excitation electrodes 16 and 17, drawn electrodes 28 and 33, and connection electrodes 27 and 29.

The excitation electrode 16, which has a rectangular shape, is formed in a central portion of a front principal surface of the resonator element 15. The connection electrode 27 is formed in one end portion of the front principal surface. The excitation electrode 16 and the connection electrode 27 are connected to each other via the drawn electrode 28.

The excitation electrode 17, which has a rectangular shape, is so formed in a central portion of a rear principal surface of the resonator element 15 that the excitation electrode 17 substantially coincides with the front excitation electrode 16 when viewed in the direction perpendicular thereto. The connection electrode 29 is formed in one end portion of the rear principal surface. The front and rear connection electrode 27, 29 are so formed that they have substantially the same shapes and coincide with each other when viewed in the direction perpendicular thereto. The excitation electrode 17 and the connection electrode 29 are connected to each other via the drawn electrode 33 provided on the rear principal surface.

Package of Resonator

The package 13 as a container shown in FIGS. 4A and 4B has a bottom plate 11, a frame-shaped sidewall 12, which is provided along a circumferential edge portion of the front surface of the bottom plate 11, and a seam ring (not shown), as a bonding material provided on the upper surface of the sidewall 12. The package 13 accommodates the resonator element 15.

The package 13 has a recess (internal space 14) that opens through the upper surface of the package 13, as shown in FIGS. 4A and 4B. The opening of the recess is blocked with the lid 26 as a lid member, which is bonded to the sidewall 12 via the seam ring (not shown) as a bonding material. The opening of the recess of the package 13 is so blocked that a sealed internal space 14 is formed. In the sealed internal space 14, the internal pressure can be set at a desired value. For example, the internal space 14 can be filled with a nitrogen gas with the internal pressure set at the atmospheric pressure, or the internal space 14 can be a vacuum (a space filled with a gas having a pressure lower than the typical atmospheric pressure (lower than or equal to $1 \times 10^5$ Pa to $1 \times 10^{-10}$ Pa (JIS Z 8126-1:1999)), whereby the resonator element 15 can keep oscillating in a more stable manner. The internal space 14 in the present embodiment is set to be the vacuum described above.

The frame-shaped sidewall 12 is disposed along a substantially rectangular circumference. In other words, the opening of the recess described above that opens through the upper surface thereof has a substantially rectangular shape. The recess surrounded by the plate-shaped bottom plate 11 and the frame-shaped sidewall 12 forms the internal space (accommodation space) 14, which accommodates the resonator element 15. The seam ring (not shown) that is made, for example, of kovar or any other alloy, is disposed on the upper surface of the frame-shaped sidewall 12. The seam ring has a function as a bonding material that bonds the lid 26 as a lid member to the sidewall 12, and the seam ring has a frame-like shape (substantially rectangular circumferential shape) and is disposed along the upper surface of the sidewall 12.

The package 13 is made of a material having a coefficient of thermal expansion equal to or as close as possible to those of the resonator element 15 and the lid 26. In this example, the package 13 is made of a ceramic material. The package 13 is formed by layering green sheets molded into a predetermined shape and baking the layered green sheets. A green sheet is formed, for example, by dispersing ceramic powder in a predetermined solution, adding a binder to the solution to form a kneaded material, and shaping the kneaded material into a sheet.

Pad electrodes 22 and 23 are formed on the substrate that forms the bottom of the package 13. The pad electrodes and 23 are formed, for example, by providing a silver/palladium electrically conductive paste or a tungsten metallization material, shaping the material into a necessary shape followed by baking, and plating the baked material with nickel and gold, silver, or any other substance. The pad electrode 22 and 23 are so provided at two locations in this example that they are connected to the connection electrodes 27 and 29 of the resonator element 15, which will be described later, and the pad electrodes 22 and 23 are electrically connected to outer connection terminals (not shown) formed on an outer bottom portion of the package 13.

The resonator element 15 is accommodated in the recess surrounded by the sidewall 12 of the package 13 and so disposed that the connection electrode 29 on the rear principal surface faces the PAD electrode 23 and is connected thereto with an electrically conductive adhesive 21 as a bonding material. The connection electrode 27 on the front principal surface is electrically connected to the PAD electrode 22 with a metal wiring line (bonding wire) 24.

The lid 26, which is a plate-shaped member, blocks the opening of the recess that opens through the upper surface of the package 13 and is bonded to a portion around the opening of the recess, for example, in a seam welding process. The lid 26 in this example, which has a plate-like shape, is readily formed and further excels in shape stability. Further, the lid 26 in this example is formed of a kovar plate. Using a kovar plate to form the lid 26 allows the lid 26 to readily and reliably seal the recess because the seam ring and the lid 26, which are both made of kovar, are not only melted in the same manner and form the same melted state but also likely to be alloyed with each other in the sealing process. The lid 26 may instead be formed of a plate made of any other suitable material instead of kovar. For example, 42 Alloy, stainless steel, or any other metal material, or the same material as that of the sidewall 12 of the package 13 can be used.

The above description has been made with reference to the case where crystal is used as the piezoelectric material that forms the resonator element 15, but the piezoelectric material is not limited to crystal and lithium tantalite, lithium niobate, or any other piezoelectric material can be used. Further, the resonator element 15 may instead be formed of a MEMS (micro electro mechanical systems) element in which a resonator element is formed on a silicon or glass substrate. Still further, the resonator element 15 may be a resonator element in which a resonator piece is formed on a silicon or glass substrate.

Variation of First Substrate

Figure 5A:
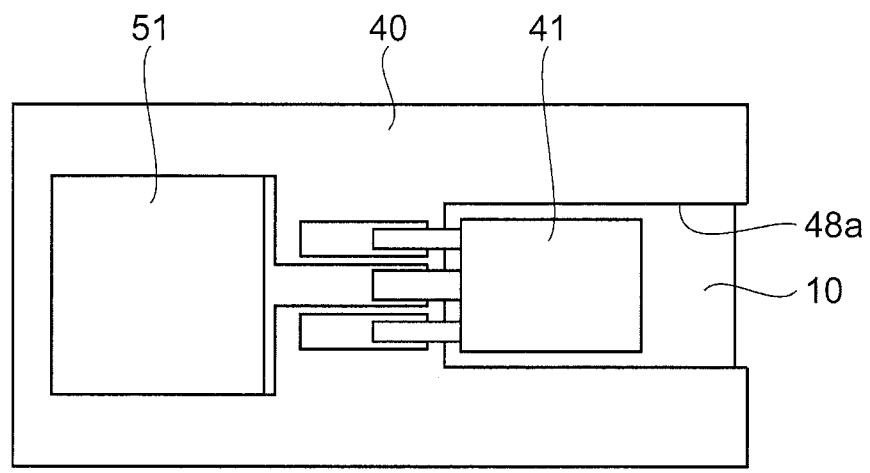
FIGS. 5A and 5B show variations of a through portion in which a heat generator is disposed and are cross-sectional views taken along in the same manner as in FIG. 2.
Figure 5B:
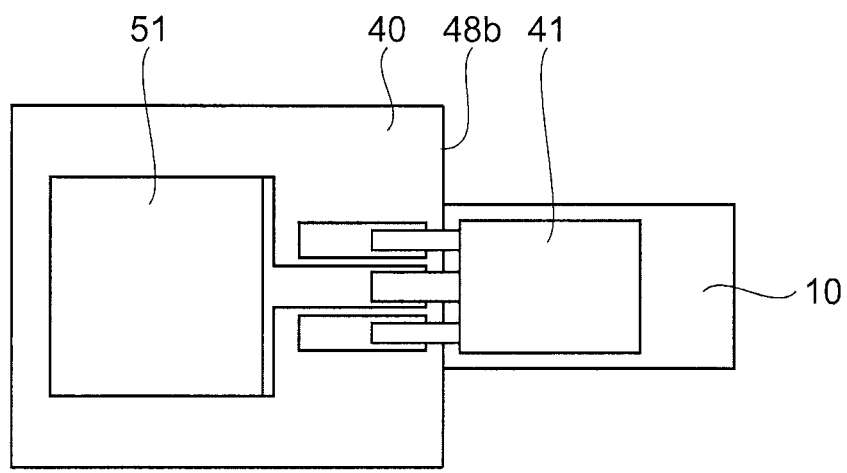

Variations of the through portion 48 of the first substrate 40 having the configuration described above will be described with reference to FIGS. 5A and 5B. FIGS. 5A and 5B show variations of the through portion in which a heat generator is disposed and are cross-sectional views corresponding to the cross section taken along the line A-A in FIG. 1B. The same portions as those in the configuration described above have the same reference characters and will not be described.

A through portion 48a in Variation 1 shown in FIG. 5A is formed by cutting the first substrate 40 from one end thereof. In other words, the through portion 48a opens through the one end of the first substrate 40.

A through portion 48b in Variation 2 shown in FIG. 5B has a configuration in which the portion of the first substrate 40 where the heat generator 41 and the resonator 10 are disposed is removed. The heat generator 41 and the resonator 10 are therefore supported in the form of a cantilever by the first substrate 40.

In the configurations in Variations 1 and 2 described above, in which the volume of the first substrate 40 is reduced, that is, the heat capacity of the first substrate 40 is reduced, the efficiency of heating the first substrate can be increased, as in the case of the through portion 48 described above.

According to the electronic device 1 of the first embodiment described above, the outer connection terminal 18 of the resonator 10, on which the heat generator 41 is mounted and which is heated by the heat generator 41, is connected to the first surface 40a of the first substrate 40, and the terminal 47 of the heat generator 41 is disposed on the second surface 40b of the first substrate 40. The heat from the heat generator is therefore conducted not only to the first surface of the first substrate via the resonator but also to the second surface of the first substrate via the terminal, whereby the two surfaces of the first substrate 40 are heated.

As a result, the two surfaces of the first substrate 40 can be uniformly heated, whereby the circuit part 51 and other electronic parts disposed on the first substrate 40 can be efficiently heated. The electronic parts can therefore be maintained at fixed temperatures and efficiently heated, whereby an electronic device with stable characteristics maintained can be provided even when the electronic device uses electronic parts having temperature-sensitive characteristics.

The above description has been made with reference to an OCXO (oven controlled xtal oscillator) including an AT-cut crystal substrate or an SC-cut crystal substrate as an example of the electronic device, but the electronic device is not limited to an OCXO. For example, the invention is also applicable to a resonator and an oscillator, that accommodates a tuning fork quartz crystal resonator element or a resonator element having any other form, a sensor device that accommodates a sensor element capable of measuring acceleration, angular speed, pressure, or any other quantity instead of a resonator element, a semiconductor device that accommodates a circuit element, or any other electronic device that requires temperature control.

Second Embodiment

Figure 6A:
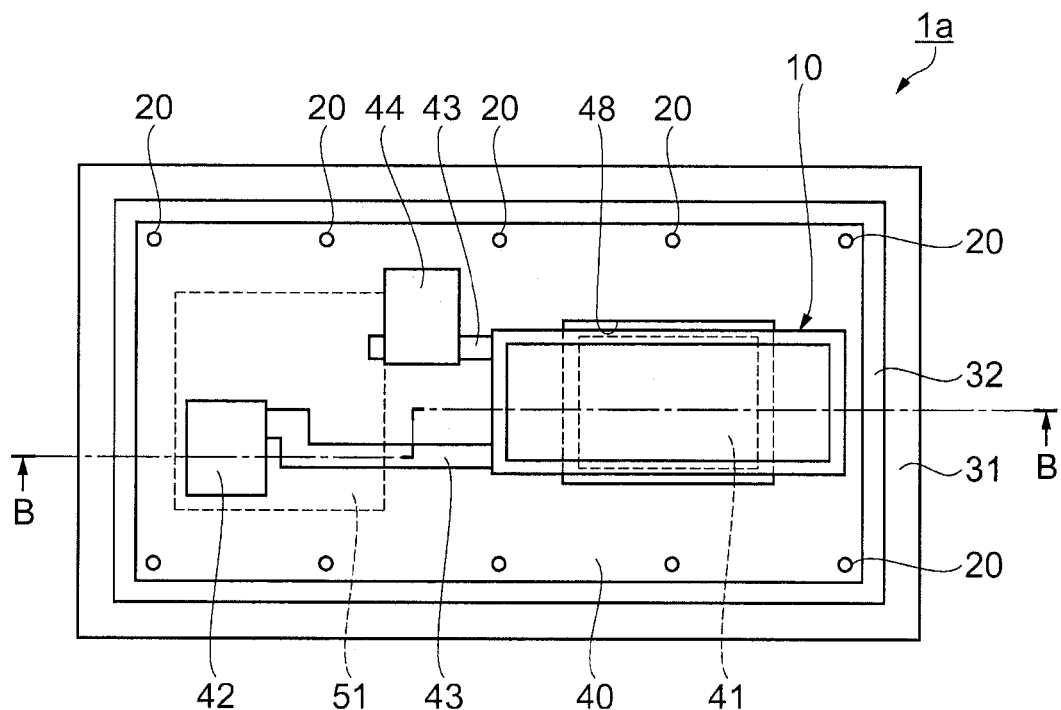
FIGS. 6A and 6B are schematic configuration diagrams of an electronic device according to a second embodiment of the invention.
Figure 6B:
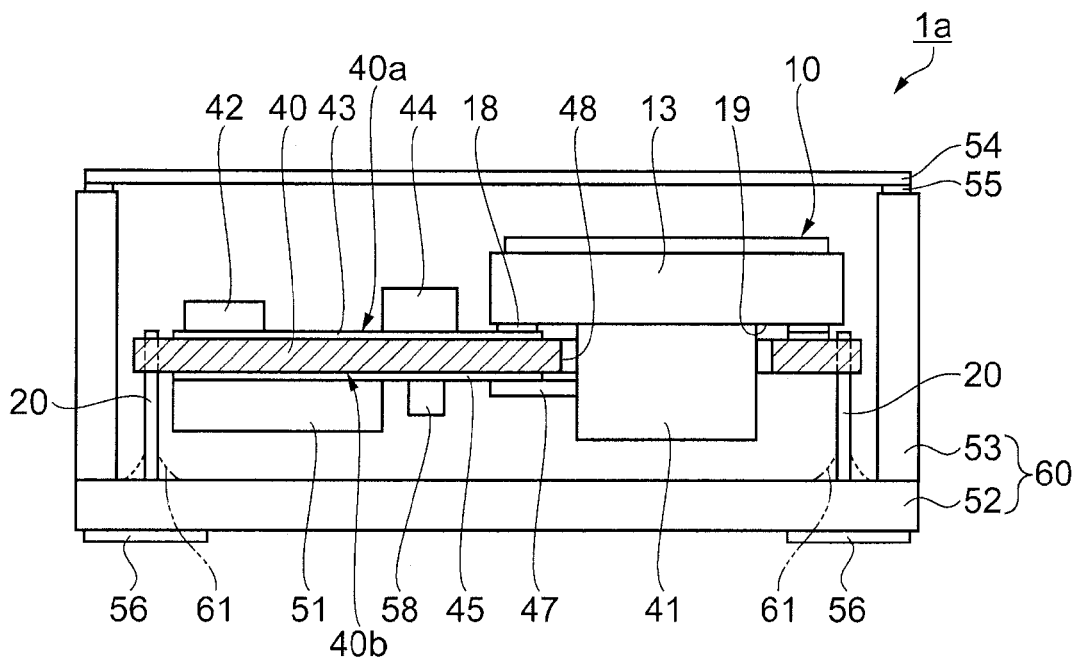

An electronic device according to a second embodiment of the invention will next be described with reference to FIGS. 6A and 6B. FIGS. 6A and 6B are schematic configuration diagrams of the electronic device according to the second embodiment. FIG. 6A is a schematic plan view showing the interior of the electronic device, and FIG. 6B is a cross-sectional view of the electronic device taken along the line B-B in FIG. 6A. The electronic device 1a according to the second embodiment differs from the electronic device 1 according to the first embodiment described above in terms of the configuration of the package. In the following description, configurations different from those in the first embodiment described above will be primarily described, and the same configurations as those in the first embodiment described above have the same reference characters and will not be described in detail.

The electronic device 1a shown in FIGS. 6A and 6B includes a package 60, which has a recess as an accommodation space, and a lid 54, which serves as a lid member that blocks the opening of the recess. The accommodation space in the package 60 accommodates the first substrate 40, to which the resonator 10, the heat generator 41, the circuit part 51, and other electronic parts are connected. The first substrate 40 is at least mechanically connected to a bottom plate 52, which serves as the second substrate, via pin members 20, each of which serves as an electrically conductive member. The package 60 and the pin members 20, which are configured differently from those in the first embodiment, will be sequentially described below in detail, and the other components will not be described.

The package shown in FIGS. 6A and 6B has the bottom plate 52, which serves as the second substrate, a frame-shaped sidewall 53, which is provided along a circumferential edge portion of the surface of the bottom plate 52, and a seam ring 55, which serves as a bonding material provided on the upper surface of the sidewall 53. The package 60 accommodates the first substrate 40, the resonator 10, the heat generator 41, the circuit part 51, and other components.

The package 60 has a recess (accommodation space) that opens through the upper surface of the package 60. The opening of the recess is blocked with the lid 54, which is bonded to the sidewall 53 via the seam ring 55, which serves as a bonding material. The opening of the recess of the package 60 is so blocked that a sealed internal space is formed. In the sealed internal space, the internal pressure can be set at a desired value. For example, the internal space can be filled with a nitrogen gas with the internal pressure set at the atmospheric pressure, or the internal space can be a vacuum (a space filled with a gas having a pressure lower than the typical atmospheric pressure (lower than or equal to $1\times10^5$ Pa to $1\times10^{-10}$ Pa (JIS Z 8126-1:1999)), whereby more stable characteristics of the electronic device can be maintained. The internal space in the present embodiment is set to be the vacuum described above.

The frame-shaped sidewall 53 is disposed along a substantially rectangular circumference. In other words, the opening of the recess described above that opens through the upper surface thereof has a substantially rectangular shape. The recess surrounded by the plate-shaped bottom plate 52 and the frame-shaped sidewall 53 forms the internal space that accommodates the first substrate 40, the resonator 10, the heat generator 41, the circuit part 51, and other components. The seam ring 55, which is made, for example, of kovar or any other alloy, is disposed on the upper surface of the frame-shaped sidewall 53. The seam ring 55 has a function as a bonding material that bonds the lid 54 to the sidewall 53, and the seam ring 55 has a frame-like shape (substantially rectangular circumferential shape) and is disposed along the upper surface of the sidewall 53.

The package 60 is made of a material having a coefficient of thermal expansion equal to or as close as possible to that of the lid 54. In this example, the package 60 is made of a ceramic material. The package 60 is formed by layering green sheets molded into a predetermined shape and baking the layered green sheets. A green sheet is formed, for example, by dispersing ceramic powder in a predetermined solution, adding a binder to the solution to form a kneaded material, and shaping the kneaded material into a sheet.

Electrodes (not shown) are formed on the bottom plate 52, which serves as the second substrate and forms the bottom of the package 60. The electrodes are formed, for example, by providing a silver/palladium electrically conductive paste or a tungsten metallization material, shaping the material into a necessary shape followed by baking, and plating the baked material with nickel and gold, silver, or any other substance. Each of the electrodes is connected to the corresponding pin member 20 with a bonding material 61, and the connected pin members 20 separate the first substrate 40 from the bottom plate 52, which serves as the second substrate. The electrodes are provided at a plurality of locations and include those electrically connected to outer electrodes 56 provided on the rear surface of the bottom plate 52.

Other forms and advantageous effects of the electronic device 1a are the same as those of the electronic device 1 according to the first embodiment. According to the electronic device 1a of the second embodiment, the outer connection terminal 18 of the resonator 10, on which the heat generator 41 is mounted and which is heated by the heat generator 41, is connected to the first surface 40a of the first substrate 40, and the terminal 47 of the heat generator 41 is disposed on the second surface 40b of the first substrate 40, whereby the two surfaces of the first substrate 40 are heated. As a result, the two surfaces of the first substrate 40 can be uniformly heated, whereby the circuit part 51 and other electronic parts disposed on the first substrate 40 can be efficiently heated. The electronic parts can therefore be maintained at fixed temperatures and efficiently heated, whereby an electronic device 1a with stable characteristics maintained can be provided even when the electronic device 1a uses electronic parts having temperature-sensitive characteristics.

Third Embodiment

Figure 7A:
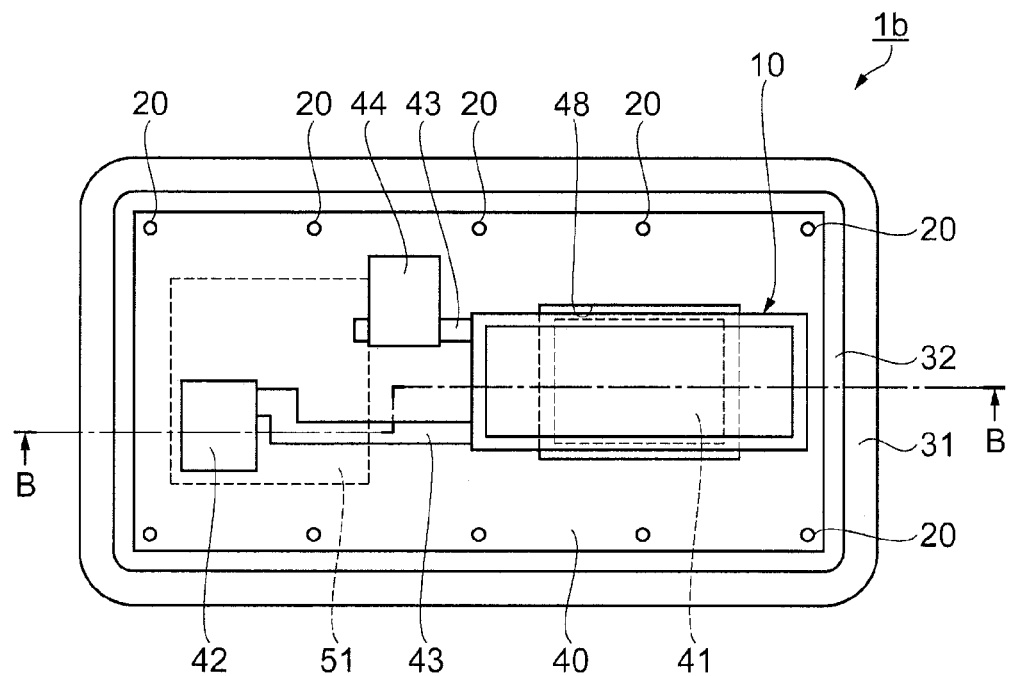
FIGS. 7A and 7B are schematic configuration diagrams of an electronic device according to a third embodiment of the invention.
Figure 7B:
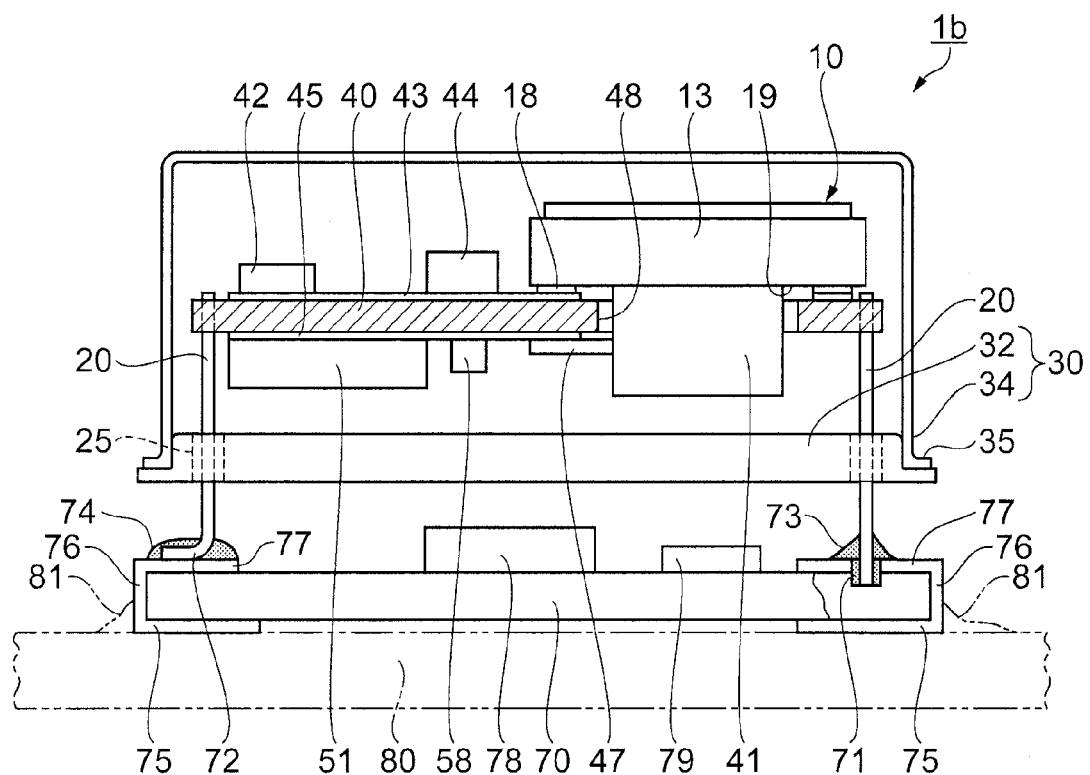

An electronic device according to a third embodiment of the invention will next be described with reference to FIGS. 7A and 7B. FIGS. 7A and 7B are schematic configuration diagrams of the electronic device according to the third embodiment. FIG. 7A is a schematic plan view showing the interior of the electronic device, and FIG. 7B is a cross-sectional view of the electronic device taken along the line B-B in FIG. 7A. The electronic device 1b according to the third embodiment differs from the electronic device 1 according to the first embodiment described above in that a third substrate 70 is provided in addition to the configuration of the electronic device 1 according to the first embodiment described above. In the following description, configurations different from those in the first embodiment described above will be primarily described, and the same configurations as those in the first embodiment described above have the same reference characters and will not be described in detail.

The electronic device 1b shown in FIGS. 7A and 7B includes the first substrate 40, to which the resonator 10, the heat generator 41, the circuit part 51, and other electronic parts are connected, the second substrate 32, which is at least mechanically connected to the first substrate 40 via pin members 20, each of which serves as an electrically conductive member, and the cover 34, which is a lid that surrounds and accommodates the first substrate 40 and is connected to the second substrate 32. Further, in the electronic device 1b, the pin members 20, which protrude from the first substrate 40, are connected to a third substrate 70, which is so disposed that it faces the outer surface (rear surface) of the second substrate 32.

The third substrate 70 is made of a ceramic material, a glass epoxy material, or any other insulating material. Wiring lines (not shown) are provided on the upper surface of the third substrate 70 or the surface thereof facing the second substrate 32. The wiring lines are formed by depositing tungsten (W), molybdenum (Mo), or any other metal material on the substrate in a screen printing process followed by baking, and plating the printed substrate with nickel (Ni), gold (Au), or any other substance or by coating a copper foil over the substrate and forming the wiring lines in an etching process, as in the case of the wiring lines 43, 45, and 45b on the first substrate 40. Part of the wiring lines form connection electrodes 77, each of which is connected to the corresponding pin member 20. The end of each of the pin members 20 is connected to the corresponding connection electrode 77 with a bonding material 73 or 74, such as a soldering material or an electrically conductive adhesive, in such a way that the pin member 20 stands upward and supports the second substrate 32.

Each of the pin members 20 has, for example, connection portion 72 produced by bending an end portion of the pin member 20, and the bent connection portion 72 is connected to the corresponding connection electrode 77 with the bonding material 74. As another example, an end portion of each of the pin members 20 is inserted into a recess 71 provided in the third substrate 70, and the pin member 20 is connected to the corresponding connection electrode 77 with the bonding material 73.

Outer terminals 75 are provided on the rear surface of the third substrate 70. Each of the outer terminals 75 is connected to the corresponding connection electrode 77 via a wiring line 76, which extends along the side surface of the third substrate 70. The outer terminals 75 are electrodes that connect the electronic device 1b to amount substrate 80, and the outer terminals 75 are electrically and otherwise connected to the mount substrate 80, for example, by using a soldering material 81. As described above, since the pin members 20 as electrically conductive members and the outer terminals 75 are not directly connected to each other but connected to each other via the wiring lines 76, the heat conduction path through which heat is conducted from the first substrate can be increased, whereby the mount substrate 80, on which the electronic device 1b is mounted, is unlikely to directly thermally affect the first substrate.

Further, since the third substrate 70 is separated from the second substrate 32, an electronic part having characteristics that are not likely to change with temperature or characteristics that are not so sensitive to temperature can be mounted on the upper surface of the third substrate 70. Since an electronic part having characteristics that are not so sensitive to temperature can therefore be disposed on the third substrate, the area of the first substrate 40 can be reduced, whereby a compact electronic device 1b having a further reduced planar area with the increased heated efficiency maintained can be provided.

Electronic Apparatus

An electronic apparatus using any of the electronic devices 1, 1a, and 1b according to the embodiments of the invention will next be described in detail with reference to FIGS. 8 to 10. The following description will be made of a case where the electronic device 1 is used.

Figure 8:
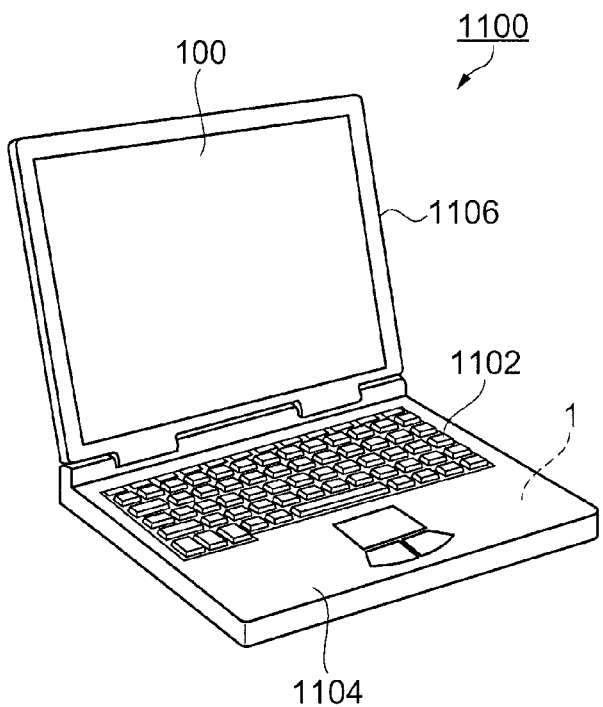
FIG. 8 is a perspective view showing the configuration of a mobile (or notebook) personal computer as an electronic apparatus including the electronic device according to any of the embodiments of the invention.

FIG. 8 is a perspective view showing the configuration of a mobile (or notebook) personal computer as an electronic apparatus including the electronic device according to the embodiment of the invention. In FIG. 8, a personal computer 1100 is formed of the following components: a body 1104 including a keyboard 1102; and a display unit 1106 including a display section 100, and the display unit 1106 is so supported by the body 1104 via a hinge structure that the display unit 1106 is pivotal relative to the body 1104. The thus configured personal computer 1100 accommodates the electronic device 1.

Figure 9:
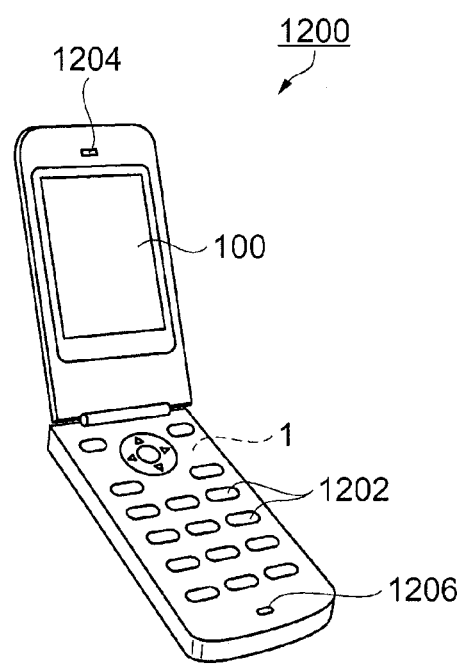
FIG. 9 is a perspective view showing the configuration of a mobile phone (including PHS) as an electronic apparatus including the electronic device according to any of the embodiments of the invention.

FIG. 9 is a perspective view showing the configuration of a mobile phone (including PHS) as an electronic apparatus including the electronic device according to the embodiment of the invention. In FIG. 9, a mobile phone 1200 includes a plurality of operation buttons 1202, a receiver 1204, and a transmitter 1206, and a display section 100 is disposed between the operation buttons 1202 and the receiver 1204. The thus configured mobile phone 1200 accommodates the electronic device 1.

Figure 10:
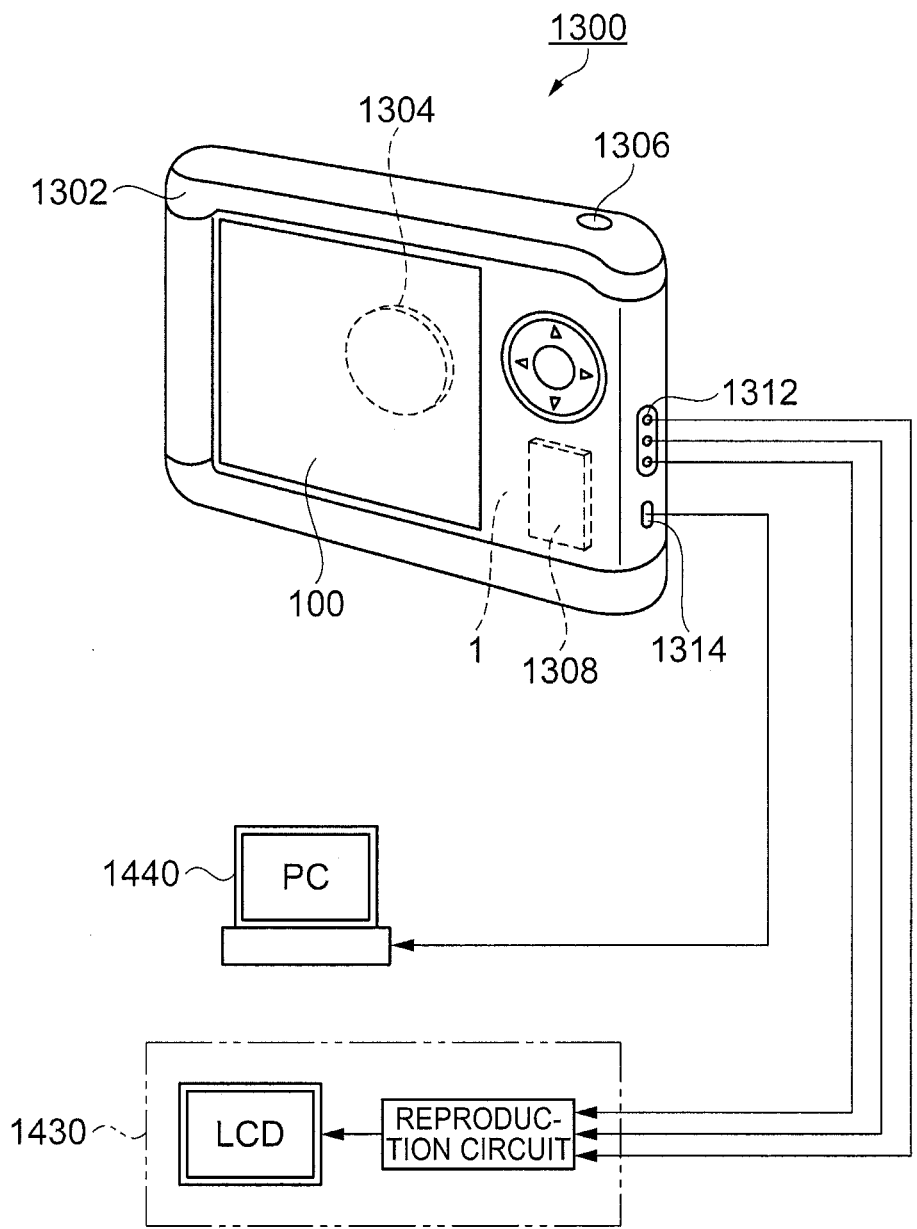
FIG. 10 is a perspective view showing the configuration of a digital camera as an electronic apparatus including the electronic device according to any of the embodiments of the invention.

FIG. 10 is a perspective view showing the configuration of a digital camera as an electronic apparatus including the electronic device according to the embodiment of the invention. FIG. 10 also schematically shows connection to external apparatus. In a film camera of related art, a silver photographic film is exposed to light, specifically to an optical image of a subject, whereas a digital camera 1300 converts an optical image of a subject into a captured image signal (image signal) in a photoelectric conversion process by using a CCD (charge coupled device) or any other imaging device.

A display section 100 is provided on the rear side of a case (body) 1302 of the digital camera 1300 and displays an image based on the captured image signal from the CCD. The display section 100 thus functions as a finder that displays a subject in the form of an electronic image.

Further, a light reception unit 1304 including an optical lens (imaging system), the CCD, and other components is provided on the front side (rear side in FIG. 10) of the case 1302.

When a user of the camera checks a subject image displayed on the display section 100 and presses a shutter button 1306, a captured image signal from the CCD at that point of time is transferred to and stored in a memory 1308. Further, in the digital camera 1300, a video signal output terminal 1312 and a data communication input/output terminal 1314 are provided on a side surface of the case 1302. The video signal output terminal 1312 is connected to a television monitor 1430 as necessary, and the data communication input/output terminal 1314 is connected to a personal computer (PC) 1440 as necessary, as shown in FIG. 10. Further, in response to predetermined operation, the captured image signal stored in the memory 1308 is outputted to the television monitor 1430 or the personal computer 1440. The thus configured digital camera 1300 accommodates the electronic device 1.

An electronic apparatus including the electronic device 1 according to the embodiment of the invention can be not only the personal computer 1100 shown in FIG. 8, the mobile phone 1200 shown in FIG. 9, and the digital camera 1300 shown in FIG. 10 but also, for example, an inkjet-type liquid ejection apparatus (inkjet printer, for example), a laptop personal computer, a television receiver, a video camcorder, a video recorder, a car navigation system, a pager, an electronic notebook (including electronic notebook having communication capability), an electronic dictionary, a desktop calculator, an electronic game console, a word processor, a workstation, a TV phone, a security television monitor, electronic binoculars, a POS terminal, a medical apparatus (such as electronic thermometer, blood pressure gauge, blood sugar meter, electrocardiograph, ultrasonic diagnostic apparatus, and electronic endoscope), a fish finder, a variety of measuring apparatus, a variety of instruments (such as instruments in vehicles, airplanes, and ships), a flight simulator, an apparatus for a mobile communication base station, a router, a switch, or any other storage area network apparatus, a local area network apparatus, and a network transmission apparatus.

Moving Object

Figure 11:
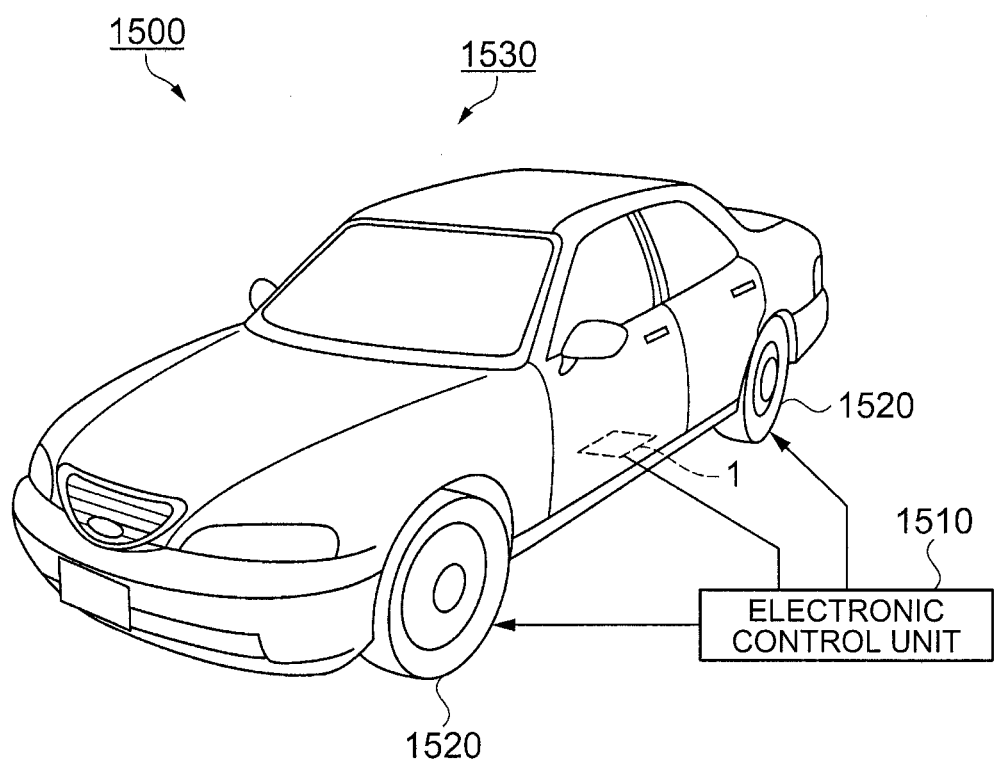
FIG. 11 is a perspective view showing the configuration of an automobile as a moving object including the electronic device according to any of the embodiments of the invention.

FIG. 11 is a perspective view schematically showing the configuration of an automobile as an example of a moving object. An automobile 1500 accommodates the electronic device 1 according to the embodiment of the invention. For example, the automobile 1500 as a moving object, specifically, a vehicle body 1530 accommodates an electronic control unit 1510, which accommodates the electronic device 1 and controls wheels 1520 and other components, as shown in FIG. 11. In addition, the electronic device 1 according to the embodiment of the invention can be widely used as a keyless entry system, an immobilizer, a car navigation system, a car air conditioner, an antilock brake system (ABS), an airbag, a tire pressure monitoring system (TPMS), an engine control system, an apparatus that monitors a battery in a hybrid automobile and an electric automobile, a vehicle body attitude control system, and any other electronic control unit (ECU).

The electronic devices, the electronic apparatus, and the moving object according to the embodiments of the invention have been described with reference to the drawings, but the invention is not limited thereto and the configuration of each component can be replaced with an arbitrary configuration having the same function. Further, any other arbitrary component may be added to the embodiments of invention. Moreover, the embodiments may be combined with each other as appropriate.

The entire disclosure of Japanese Patent Application No. 2013-124421, filed Jun. 13, 2013 is expressly incorporated by reference herein.

What is claimed is:

1. An electronic device comprising:
a heat generator having a terminal;
a resonator having an outer connection terminal and a container;
a heat conduction member disposed between the resonator and the heat generator,
the outer connection terminal and the heat conduction member being disposed on a bottom surface of the container of the resonator;
a first substrate having a first surface and a second surface; and
an electronic part disposed on the first substrate,
the outer connection terminal being connected to the first surface,
the terminal of the heat generator being connected to the second surface, and
the bottom surface of the resonator at least partially facing the first substrate,
the first surface being a front surface and the second surface being a rear surface facing away from the front surface, and
a through portion that passes through the first surface and the second surface being provided, and the heat generator being disposed within the through portion and passing through the first surface and the second surface.

2. The electronic device according to claim 1,
wherein a wiring line is provided on each of the first surface and the second surface, and
at least one of the wiring line to which the terminal of the heat generator is connected and the wiring line to which the outer connection terminal is connected overlaps with the electronic part in a plan view.

3. The electronic device according to claim 1,
wherein the heat conduction member has a heat conductivity higher than the heat conductivity of the first substrate and is connected at least to the outer connection terminal, and the heat conduction member is connected at least to the first surface.

4. The electronic device according to claim 1, further comprising a second substrate at least mechanically connected to the first substrate.

5. The electronic device according to claim 4,
further comprising a lid connected to the second substrate,
wherein the second substrate and the lid surround and accommodate the first substrate.

6. The electronic device according to claim 4,
further comprising a third substrate connected to the first substrate via an electrically conductive member and supported by the electrically conductive member,
wherein the third substrate has one surface which faces the first substrate and on which the electrically conductive member stands and another surface which faces away from the one surface and on which a mount terminal is provided,
the first substrate is electrically connected to the electrically conductive member, and
the electrically conductive member passes through the second substrate and is connected to the mount terminal via a wiring line disposed on the one surface of the third substrate.

7. The electronic device according to claim 5,
further comprising a third substrate connected to the first substrate via an electrically conductive member and supported by the electrically conductive member,
wherein the third substrate has one surface which faces the first substrate and on which the electrically conductive member stands and another surface which faces away from the one surface and on which a mount terminal is provided,
the first substrate is electrically connected to the electrically conductive member, and
the electrically conductive member passes through the second substrate and is connected to the mount terminal via a wiring line disposed on the one surface of the third substrate.

8. An electronic apparatus comprising the electronic device according to claim 1.

9. A moving object comprising the electronic device according to claim 1.

* * * * *